(12) United States Patent
Fastow

(10) Patent No.: US 6,525,368 B1
(45) Date of Patent: Feb. 25, 2003

(54) HIGH DENSITY FLASH EEPROM ARRAY WITH SOURCE SIDE INJECTION

(75) Inventor: Richard Fastow, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 58 days.

(21) Appl. No.: 09/892,685

(22) Filed: Jun. 27, 2001

(51) Int. Cl.[7] .............................................. H01L 29/76
(52) U.S. Cl. ...................... 257/314; 257/326; 257/321; 257/296
(58) Field of Search ................................ 257/314, 315, 257/316, 321, 326, 296

(56) References Cited

U.S. PATENT DOCUMENTS

| | | | |
|---|---|---|---|
| 5,126,808 A | | 6/1992 | Montalvo et al. |
| 5,874,760 A | * | 2/1999 | Burns, Jr. et al. ............ 257/315 |
| 5,883,409 A | * | 3/1999 | Guterman et al. .......... 257/316 |
| 5,982,669 A | | 11/1999 | Kalnitsky et al. |
| 6,023,085 A | | 2/2000 | Fang |
| 6,066,875 A | | 5/2000 | Chen |
| 6,190,968 B1 | | 2/2001 | Kalnitsky et al. |

\* cited by examiner

*Primary Examiner*—Richard Elms
*Assistant Examiner*—Brad Smith
(74) *Attorney, Agent, or Firm*—Renner, Otto, Boisselle & Sklar, LLP

(57) ABSTRACT

A flash electrically eraseable programmable read only memory (EEPROM) includes a plurality of flash memory cells formed on a semiconductor substrate, the plurality of memory cells being arranged in a matrix of m rows and n columns. The memory cells in each column are connected in series and include a drain coupled to a common bit line. In addition, the EEPROM includes a plurality of trenches formed in the semiconductor substrate, each of the plurality of trenches being formed between a corresponding pair of the n columns of memory cells. Moreover, the EEPROM includes a plurality of transistors formed at least in part in a corresponding sidewall of the plurality of trenches, each of the plurality of transistors connecting a source of a corresponding one of the memory cells to a Vss supply voltage.

10 Claims, 7 Drawing Sheets

HIGH DENSITY FLASH EEPROM ARRAY WITH SOURCE SIDE INJECTION

TECHNICAL FIELD

The present invention relates generally to an array of flash electrically erasable programmable read only memory (EEPROM) cells and, in particular, to an architecture for an array of flash EEPROM cells with source side injection.

BACKGROUND OF THE INVENTION

A "flash" type electrically erasable programmable read only memory (EEPROM) includes a plurality of memory cells each of which includes a floating gate in a field effect transistor structure. The floating gate is positioned over but insulated from a channel region in a semiconductor substrate, between source and drain regions. A control gate is then provided over the floating gate, but is also insulated therefrom. The threshold voltage characteristic of the transistor is controlled by the amount of charge that is retained on the floating gate. That is, the minimum amount of voltage (threshold) that must be applied to the control gate before the transistor is turned "on" to permit conduction between its source and drain regions is controlled by the level of charge on the floating gate. A transistor is programmed to one of two states by accelerating electrons from the substrate channel region, through a thin gate dielectric and onto the floating gate.

The state of the memory cell transistor is read by placing an operating voltage across its source and drain and on its control gate, and then detecting the level of current flowing between the source and drain as to whether the device is programmed to be "on" or "off" at the control gate voltage selected. A specific, single cell in a two-dimensional array of EEPROM cells is addressed for reading by application of a source-drain voltage to source and drain lines in a column containing the cell being addressed, and application of a control gate voltage to the control gates in a row containing the cell being addressed.

Current trends are directed towards the desirability of providing flash EEPROMs with increased storage capacity and reduced substrate size. While the benefits of scaling are suitable to a certain extent, problems can arise as the size of the EEPROM memory cells is further reduced. For example, short channel effects begin to adversely impact operation of the memory cells. In addition, high programming currents may become necessary.

In view of the aforementioned shortcomings associated with conventional flash EEPROMs, there is a strong need in the art for a flash EEPROM memory cell array which allows for continued scaling. More specifically, there is a strong need in the art for an array which provides for increased memory cell density while avoiding short channel effects and/or the need for high programming currents.

SUMMARY OF THE INVENTION

According to the present invention, a flash EEPROM array is provided which has a unique split gate architecture. Such architecture provides for high density arrangement of the memory cells using source side injection. The split gate array architecture of the present invention is particularly well suited for continued scaling with current flash processing technology.

In accordance with one particular aspect of the present invention, a flash electrically erasable programmable read only memory (EEPROM) is provided. The EEPROM includes a plurality of flash memory cells formed on a semiconductor substrate, the plurality of memory cells being arranged in a matrix of m rows and n columns, wherein the memory cells in each column are connected in series and include a drain coupled to a common bit line. In addition, the EEPROM includes a plurality of trenches formed in the semiconductor substrate, each of the plurality of trenches being formed between a corresponding pair of the n columns of memory cells. Moreover, the EEPROM includes a plurality of transistors formed at least in part in a corresponding sidewall of the plurality of trenches, each of the plurality of transistors connecting a source of a corresponding one of the memory cells to a Vss supply voltage.

According to another aspect of the invention, a method is provided for making a flash EEPROM. The method includes the step of forming a plurality of flash memory cells formed on a semiconductor substrate, the plurality of memory cells being arranged in a matrix of m rows and n columns, wherein the memory cells in each column are connected in parallel and include a drain coupled to a common bit line. The method further includes the steps of forming a plurality of trenches in the semiconductor substrate, each of the plurality of trenches being formed between a corresponding pair of the n columns of memory cells; and forming a plurality of transistors at least in part in a corresponding sidewall of the plurality of trenches, each of the plurality of transistors connecting a source of a corresponding one of the memory cells to a Vss supply voltage.

In accordance with still another aspect of the invention, a method is provided for forming an EEPROM. The method includes the steps of forming a plurality of trenches in a semiconductor substrate; doping the bottom of each of the trenches with a dopant; filling the trenches with a trench isolation material; forming a plurality of flash memory cells formed on the semiconductor substrate, the plurality of memory cells being arranged in a matrix of m rows and n columns separated by the plurality of trenches, wherein the memory cells in each column are connected in series and include a drain coupled to a common bit line; forming a plurality of word lines each extending along a corresponding row of the memory cells which are operative to select simultaneously each of the memory cells in the corresponding row; removing portions of the trench isolation material by a self aligned etch using the word lines as a mask to expose the bottom and sidewalls of the trenches in regions between adjacent word lines; forming an oxide layer on the exposed bottom and sidewalls of the trenches at least in the regions between the adjacent word lines; and forming a plurality of control lines each extending between and parallel to a corresponding pair of the word lines, the control lines each being operative to control the conductivity of transistors connected between the memory cells and a Vss supply voltage which are formed by a source of the connected memory cell, the doped bottom of a corresponding trench, and a channel therebetween formed in the sidewall of the corresponding trench.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DESCRIPTION OF THE PREFERRED EMBODIMENT

Figure 1:
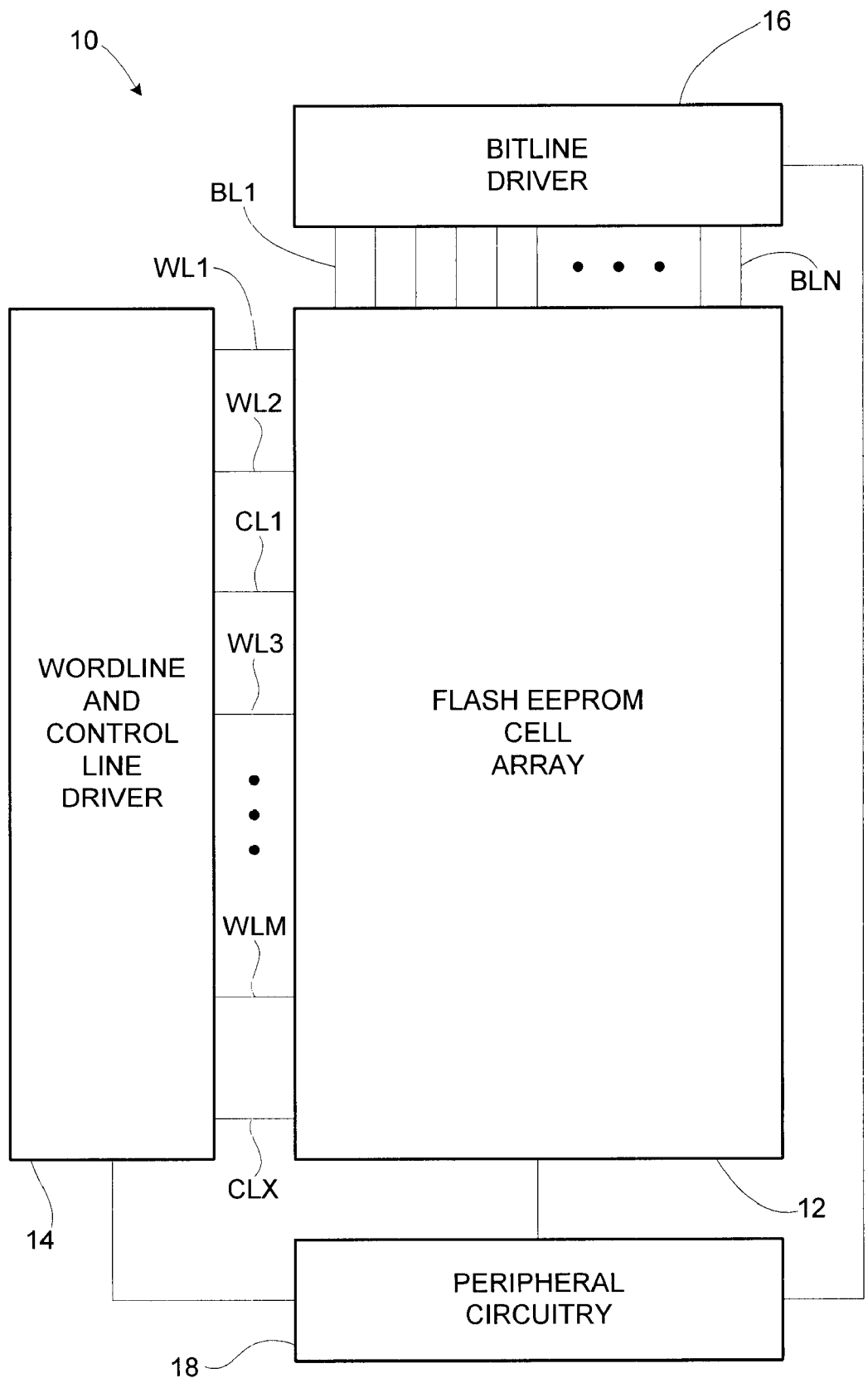
FIG. 1 is a block schematic drawing of a flash EEPROM in accordance with the present invention.

The present invention will now be described with reference to the drawings wherein like reference numerals are used to refer to like elements throughout.

Referring initially to FIG. 1, a flash EEPROM in accordance with the present invention is generally designated 10. The EEPROM 10 includes a core array 12 which is made up of an m×n array of flash memory cells as is explained in more detail below in relation to FIG. 2. A word line and control line driver 14 provides appropriate control voltages to the core array 12 via a plurality of word lines WL (e.g., WL1, WL2, . . . , WLM) and control lines CL (e.g., CL1, CL2, . . . , CLX). Such control voltages allow data to be stored in, read from or erased from the memory cells. A bit line driver 16 provides appropriate control voltages to and/or receives an output from a plurality of bit lines BL (e.g., BL1, BL2, . . . , BLN) within the array 12. In addition, the EEPROM 10 includes peripheral circuitry 18 such as address and data I/O ports, an address decoder, reference cell array, etc., as is conventional in typical EEPROMs.

The present invention is distinguishable over conventional EEPROMs primarily in the manner in which the core array 12 is configured. Accordingly, the word line and control line driver 14, bitline driver 16 and peripheral circuitry 18 will not be described in detail for sake of brevity. Those having ordinary skill in the art will readily appreciate how to make and use such elements based on the disclosure herein without additional detail.

Figure 2:
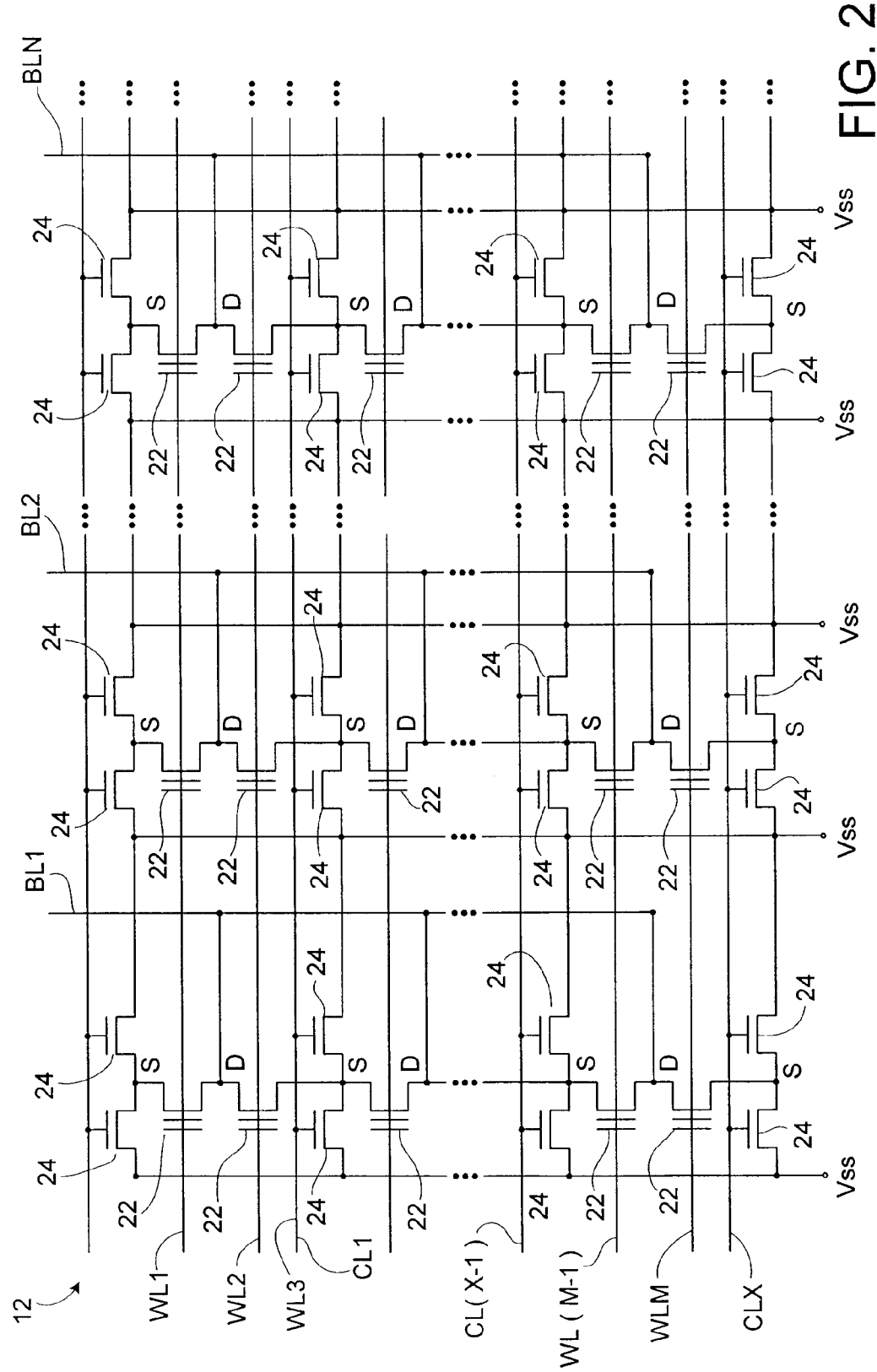
FIG. 2 is a schematic diagram of the flash EEPROM memory cell array in accordance with the present invention.

Referring now to FIG. 2, the core array 12 is represented schematically. As is shown in FIG. 2, the array 12 is made up of m rows and n columns of flash memory cells 22. As will be explained in more detail below, each flash memory cell 22 has a generally conventional metal oxide on semiconductor field effect transistor (MOSFET) design. In general, a gate stack defines a channel between a source and a drain. The gate stack includes a gate dielectric formed on a semiconductor substrate in which the channel, source and drain are located, a floating gate formed on the gate dielectric, a gate insulating layer (commonly referred to as an ONO layer) formed on the floating gate, and a control gate formed on the gate insulating layer. In the particular example described herein, the memory cells 22 are each n-channel devices although it will be appreciated that the present invention is by no means limited to the use of n-channel devices and may equally apply to p-channel devices.

The flash memory cells 22 in each column share a common bit line BL and are connected in parallel. More specifically, the drain (D) of each memory cell 22 is coupled to a corresponding bit line BL for the particular column. In addition, the source (S) of each memory cell 22 in the column is coupled to the source of an adjacent memory cell 22 on one side; and the drain of each memory cell 22 in the column is coupled to the drain of an adjacent memory cell 22 on the other side (with the obvious exception of the first and last memory cells 22 in the column).

Each word line WL extends horizontally along a corresponding row of the memory cells 22 and is coupled to the control gate of the respective memory cells 22 within that row. Thus, when a given word line WL is selected via the driver 14, all of the memory cells 22 in the row corresponding to the word line WL are selected as is conventional.

In accordance with the present invention, the core array 12 is particularly unique in the manner in which one or more series transistors 24 are provided at the source (S) of each of the memory cells 22. In the exemplary embodiment, the source (S) of each memory cell 22 is connected to the Vss supply voltage via a corresponding pair of transistors 24. The transistors 24 are preferably n-channel MOSFETs, with each having its drain coupled to the source (S) of the corresponding memory cell 22 and its source coupled to the Vss supply voltage.

As previously noted, the core array 12 includes a plurality of control lines CL (e.g., CL1, CL2, . . . , CLX). With respect to each row of memory cells 22, the gates of the transistors 24 connecting the source (S) of those memory cells 22 to the Vss supply voltage are coupled to a corresponding control line CL as shown in FIG. 2. The control line CL runs adjacent and parallel to the word line WL for the same row of memory cells 22. Moreover, rows of memory cells 22 which share a source (S) with the memory cells 22 in an adjacent row may also share the corresponding transistors 24 and control line CL as further shown in FIG. 2.

By controlling the conductivity of the series transistors 24, the core array 12 makes it possible to optimize the source side injection to each of the memory cells 22 during programming. This avoids high programming currents which may otherwise be necessary. Moreover, the particular layout of the transistors 24 in relation to the memory cells 22 provides for high density arrangement thereof as is explained more fully below in relation to FIG. 3. Consequently, further need for reduction in scale may be avoided together with any resultant short channel effects.

During a read operation, the word line WL and bit line BL of the desired memory cell 22 are biased high. The control line CL which controls the transistors 24 coupled to the source (S) of the desired memory cell 22 is also biased high so as to connect the source (S) to the Vss supply voltage.

During programming, typical voltages used for source side injection are used. That is, the word line WL and the bit line BL of the cell 22 to be programmed are biased high. In addition, however, the control line CL which controls the transistors 24 coupled to the source (S) of the cell 22 to be programmed is biased to a value predetermined to optimize source side injection. Such bias value may be determined empirically, but research has shown that such bias voltage is near the threshold voltage of the transistors 24.

An erase operation is carried out by channel erase, whereby the gates of the cells 22 are held negative via the word lines WL, while the p-well in which the memory cells 22 are formed is held positive. The control lines CL may also be held negative which will increase coupling.

Figure 3:
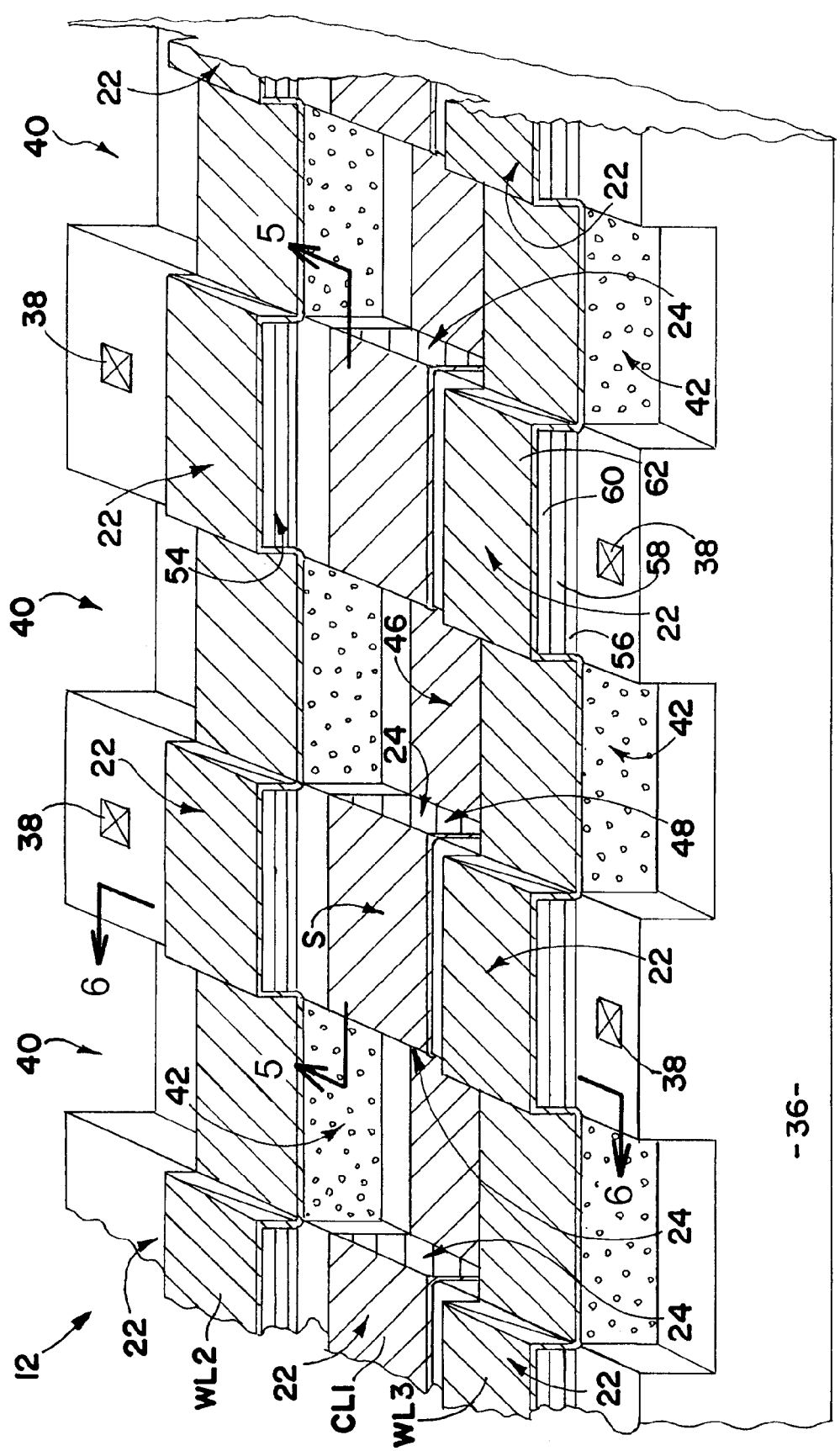
FIG. 3 is a schematic perspective view of the flash EEPROM memory cell array in accordance with the present invention.

Referring now to FIG. 3, a portion of the core array 12 is shown in perspective view to emphasize the high density arrangement provided in accordance with the present invention. The bit lines BL and oxide layer (described below) have been omitted for ease of viewing. As shown in FIG. 3, the memory cells 22 are arranged in rows (shown generally horizontally) and columns (shown generally vertically). The memory cells 22 are formed on a semiconductor substrate 36 such as silicon. The word lines WL (e.g., WL2, WL3) run horizontally and are coupled and/or from the control gate of each memory cell 22 in a corresponding row. Drain contacts 38 are shared between adjacent cells 22 in a given column in order to couple the cells 22 to a corresponding bit line BL.

Adjacent columns of memory cells 22 are separated from one another by trenches 40 formed in the substrate 38. The bottom of the trenches 40 are doped n-type in order to provide a conduction path for the sources (S) of the memory cells 22 to the Vss supply voltage. In those locations of the trenches 40 which are immediately between adjacent memory cells 22 in a given row, the trenches 40 are filled with a trench oxide 42 to provide electrical isolation therebetween.

The control lines (e.g., CL1) run parallel between the respective word lines WL (e.g., WL2 and WL3) in between the rows of memory cells 22 which share a common source (S). As will be explained in more detail below in relation to FIGS. 5A–5D and 6A–6D, the control lines CL act as the gates of the transistors 24 which are formed along the sidewalls of the trenches 40. Specifically, the source (S) of a given memory cell 22 serves as the drain of a corresponding transistor 24. The n-doped bottom 46 of the trench 40 serves as the source of the transistor 24. The sidewall 48 of the trench 40 extends between such source and drain of the transistor 24 and thus serves as a channel region. The control lines CL are formed atop an oxide layer so as to serve as the gate electrodes for the corresponding transistors 24. Thus, when a control line CL is biased high, current may flow through the trench sidewall 48 between the n-doped bottom 46 of the trench 40 and the source (S) of the corresponding memory cell 22.

Referring now to FIGS. 4, 5A–5D and 6A–6D, a method for forming the core array 12 will now be described. FIGS. 5A–5D represent the steps involved in forming the cross-section 5—5 identified in FIG. 3. Similarly, FIGS. 6A–6D illustrate the steps involved in forming the cross-section 6—6 identified in FIG. 3. FIGS. 5A–5D and 6A–6D respectively represent equivalent intermediate steps involved in the process.

Figure 4:
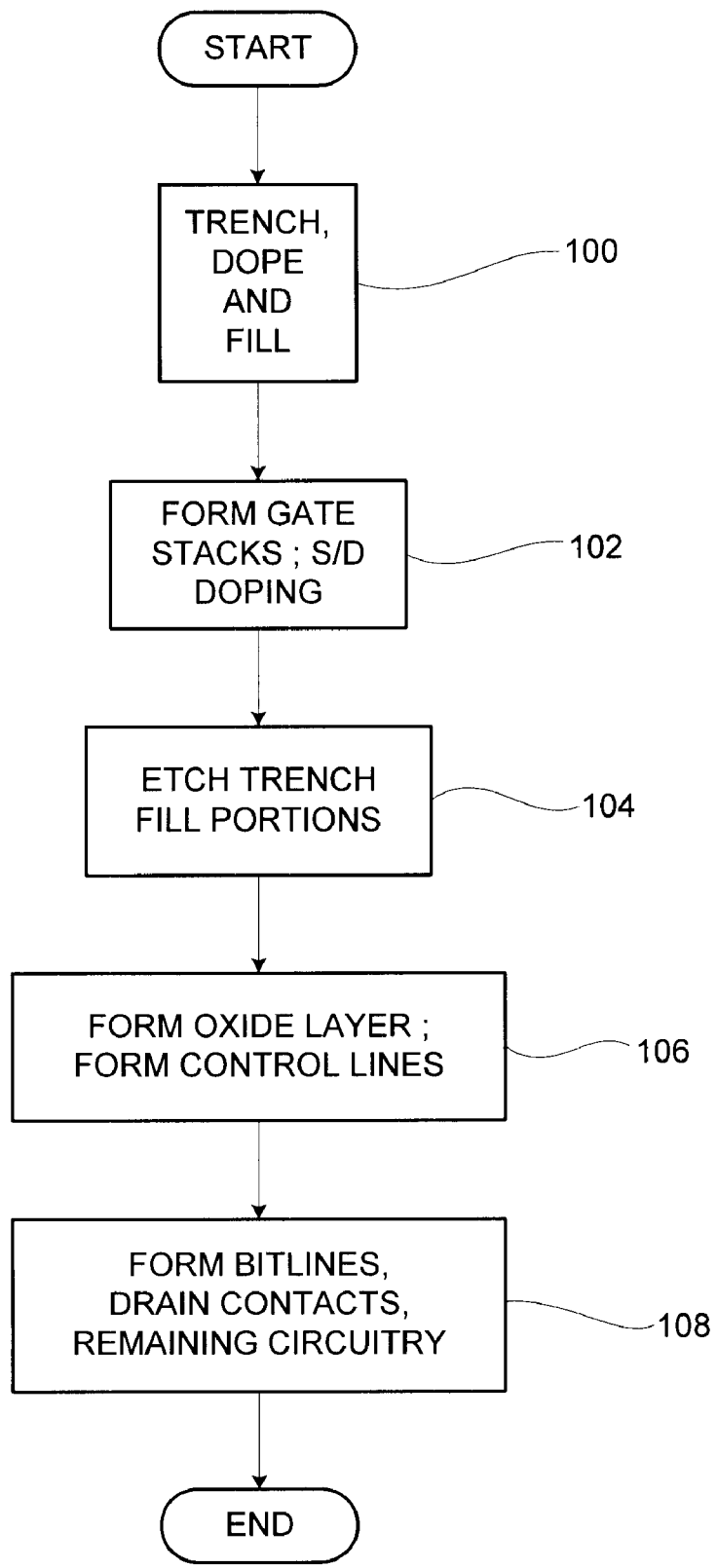
FIG. 4 is a flowchart representing in relevant part an exemplary process for making the flash EEPROM in accordance with the present invention.

Referring to FIG. 4 in particular, an initial step 100 involves taking a substrate 36 (FIG. 3) in which the core array 12 is to be formed. As noted above, the core array 12 may be a silicon substrate or some other type of semiconductor substrate. The substrate 36 preferably is doped initially to form a p-well therein in which the memory cells 22 are to be formed. Thereafter, trenches 40 are formed in the substrate 36 using known techniques associated with surface trench isolation (STI). The bottoms 46 of the trenches 40 are then doped n-type using conventional doping techniques to form source regions 52 for the transistors 24. Note that appropriate masking is utilized so as not to dope the top of the substrate 36 in between the trenches 40, or the sidewalls of the trenches. After doping the bottoms 46 of the trenches 40, the trenches 40 are filled with the trench oxide 42. Again, standard STI techniques may be utilized in order to fill the trenches 40. Thus, following step 100 the core array 12 has the construction represented by FIGS. 5A and 6A.

Next, in step 102 the gate stacks 54 (FIG. 6B) for each of the memory cells 22 are formed in columns between the trenches 40 on the substrate 36. Initially, a gate oxide layer 56 is formed. Next, a floating gate 58 is patterned and etched. The floating gate 58 may be made from polysilicon or the like using conventional techniques. An ONO layer 60 is then formed and etched to define the ONO layer 60 in each stack 54, again using conventional techniques. Finally, the control gate 62 is formed in each stack 54 by the respective word lines WL connecting the rows of memory cells 22. Again, the word lines WL and control gates 62 may be made in accordance with conventional techniques from polysilicon or the like.

Figure 5A:
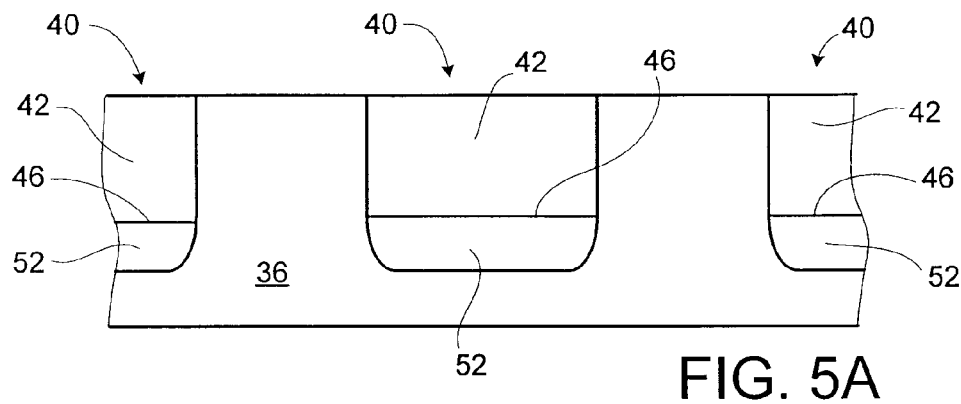
FIGS. 5A–5D and 6A–6D are cross-sectional views taken along lines 5—5 and 6—6 of FIG. 3, respectively, during the process of making the flash EEPROM in accordance with the present invention.
Figure 5B:
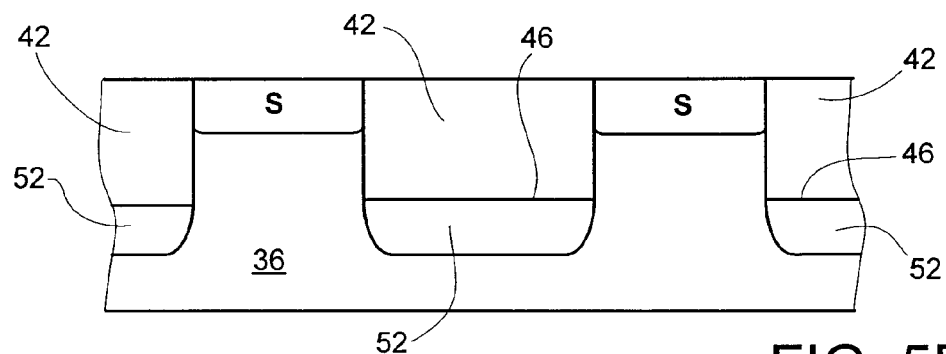
Figure 5C:
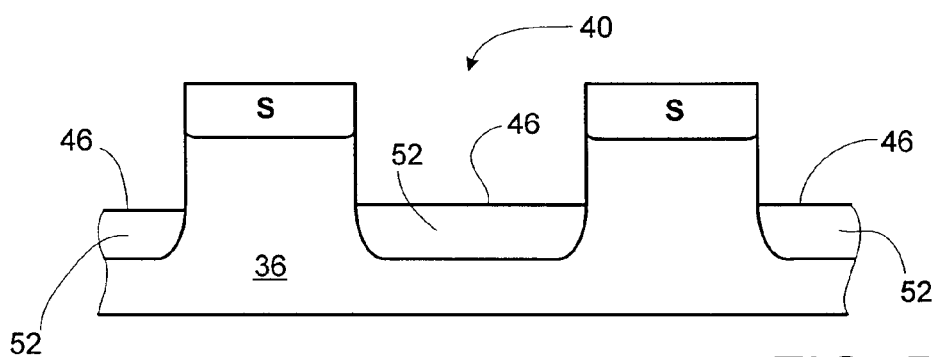
Figure 6A:
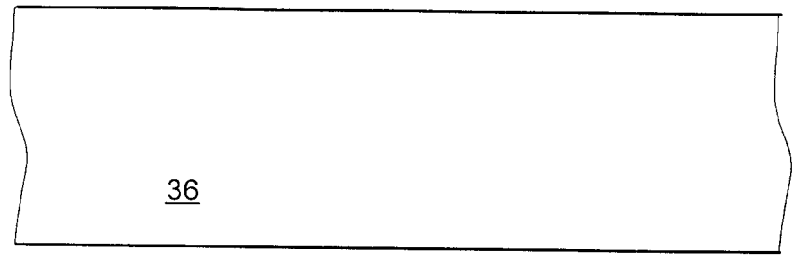
Figure 6B:
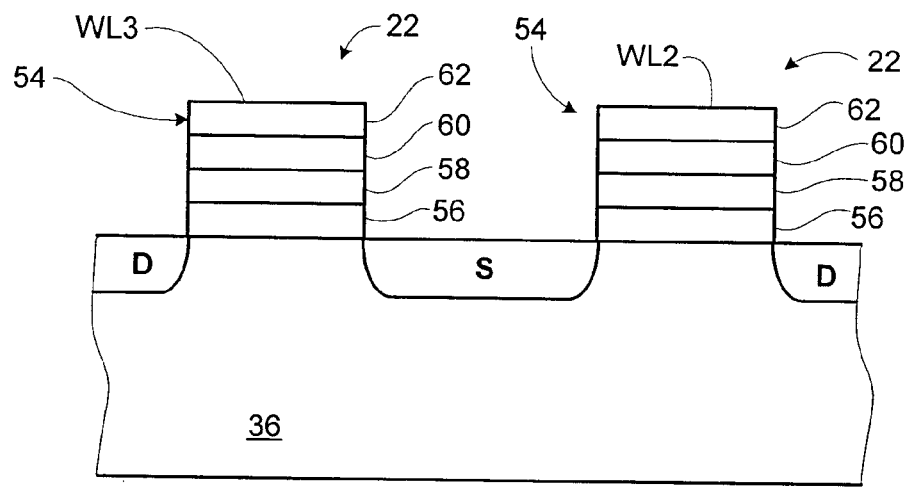
Figure 6C:
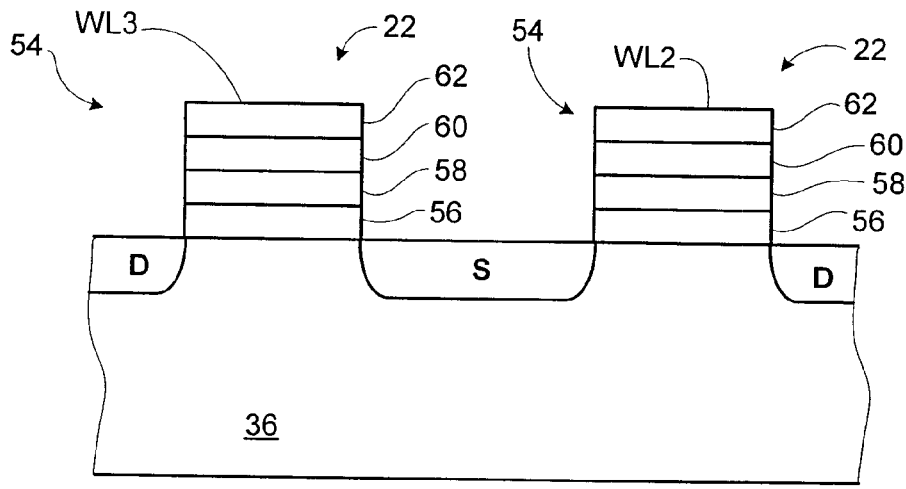

After the gate stacks 54 have been formed, the source (S) and drain (D) regions for the memory cells 22 are provided by performing a S/D implant of n-type impurities. In particular, an n-type dopant is implanted in the source and drain regions for the memory cells 22 using the word lines WL as a self aligned mask as is also conventional. As a result of step 102, the structure shown in FIGS. 5B and 6B is provided.

Next, in step 104 a trench etch is performed to remove the portions of the trench oxide 42 from the trenches 40 where the series transistors 24 will be formed. Specifically, a self-aligned surface (SAS) etch of the trench oxide 42 is performed using the word lines WL as a self-aligning mask. Conventional techniques for etching the oxide 42 selectively with respect to the polysilicon word lines WL may be used. As a result, the portions of the trench oxide 42 in the regions between adjacent memory cells 22 in a column are removed and the substrate 36 is exposed. Accordingly, following step 104 the memory cell array 12 is represented by the structure shown in FIGS. 5C and 6C.

In step 106, a thin oxide layer 66 is formed on top of the entire matrix of memory cells 22. As will be appreciated, the oxide layer 66 serves as the gate oxide 66 for the series transistors 24. In addition, the gate oxide 66 provides electrical isolation between the word lines WL and the control lines CL which are to be formed. Furthermore, the gate oxide 66 provides isolation from the sides and bottom of the trenches 40 as well as from the top of the substrate 36 in between the trenches 40.

Next, the control lines CL are formed in between the word lines WL so as to follow the contour of the substrate 36 across the trenches 40. In one embodiment, the control lines CL overlap the word lines WL, but are still isolated from the word lines WL by the gate oxide 66. The control lines CL are formed from a layer 68 of polysilicon or the like, which is deposited, patterned and etched using conventional techniques similar to those used to form the word lines WL.

Figure 5D:
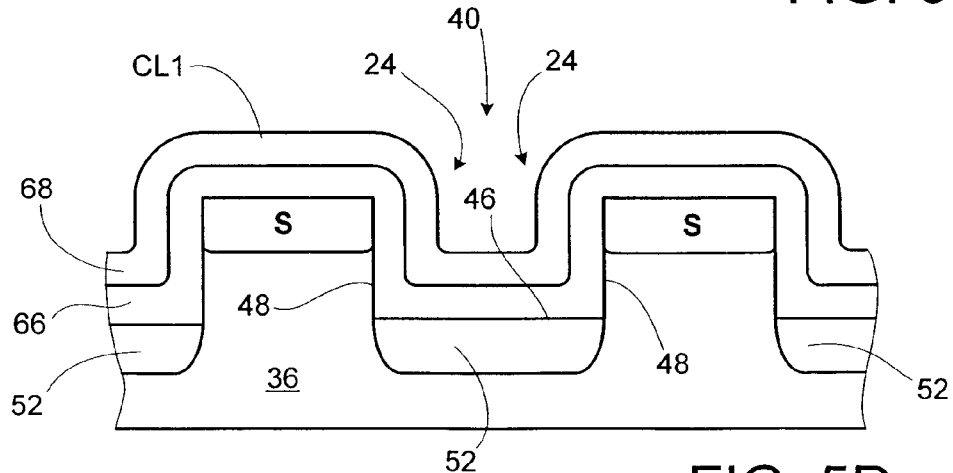
Figure 6D:
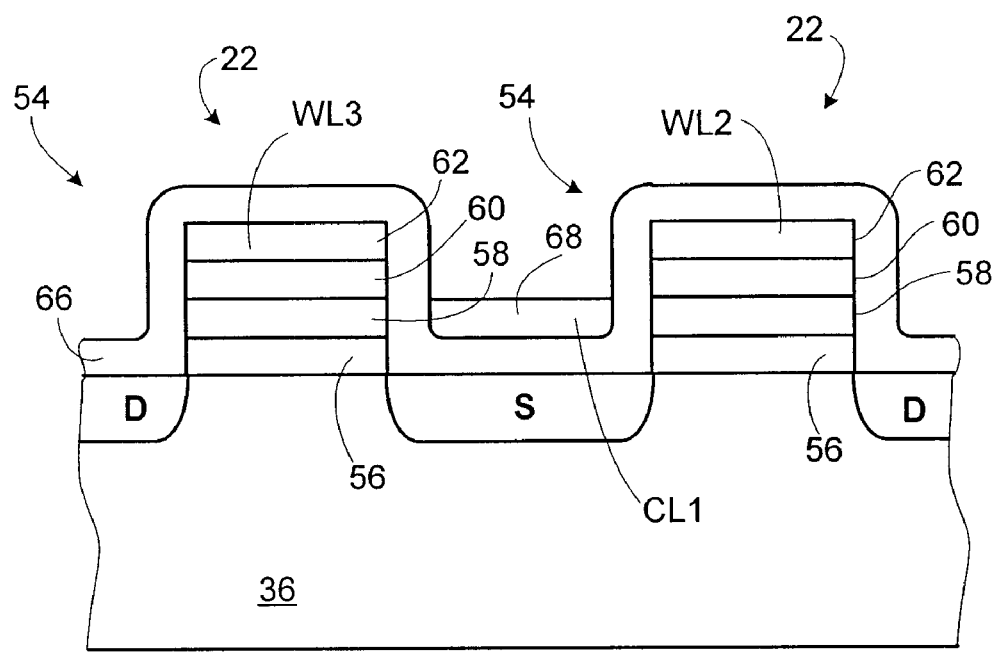

As is shown in FIGS. 5D and 6D, the control lines CL extend parallel between the word lines WL and follow the contour of the substrate 36 down one sidewall 48 of each trench 40 and up the other sidewall 48. As a result, the series transistors 24 are formed in the sidewalls 48. The drain side of each transistor 24 is formed by the source (S) of the corresponding memory cell 22, and the source side of each transistor 24 is formed by the source region 52 created by the n-type doping of the bottom 48 of the trench 40. The channel for each transistor 24 is formed in the sidewall 48, and the control line CL serves as the gate electrode.

Next, in step 108 the remaining processing for forming the device 10 is performed. Specifically, the bit lines BL are formed using conventional techniques. In addition, the bit lines BL are connected to the corresponding columns of memory cells 22 via the drain contacts 38. Moreover, the n-doped bottoms 48 of each of the trenches 40 are connected to a Vss supply voltage line. Likewise, the various other circuitry, connections, contacts, etc. are formed in step 108, all of which are conventional. Accordingly, additional detail is omitted for sake of brevity.

The present invention therefore provides a flash EEPROM 10 in which series connected transistors 24 may be provided for source side injection without occupying a significant amount of space in the cell array 12. The memory cells 22 may be located close to one another with the series connected transistors 24 being formed in the sidewalls 48 of the isolating trenches 40. This enables the designer to maintain high density within the cell array 12 and avoid the detrimental effects of short channels.

Although the invention has been shown and described with respect to certain preferred embodiments, it is obvious that equivalents and modifications will occur to others skilled in the art upon the reading and understanding of the specification. For example, an alternative process flow utilizing self-aligned trench formation may be utilized. The present invention includes all such equivalents and modifications, and is limited only by the scope of the following claims.

What is claimed is:

1. A flash electrically eraseable programmable read only memory (EEPROM), comprising:
   a plurality of flash memory cells formed on a semiconductor substrate, the plurality of memory cells being arranged in a matrix of m rows and n columns, wherein the memory cells in each column are connected in series and include a drain coupled to a common bit line;
   a plurality of trenches formed in the semiconductor substrate, each of the plurality of trenches being formed between a corresponding pair of the n columns of memory cells; and
   a plurality of transistors formed at least in part in a corresponding sidewall of the plurality of trenches, each of the plurality of transistors connecting a source of a corresponding one of the memory cells to a Vss supply voltage.

2. The EEPROM of claim 1, wherein the source and drain of the memory cells have a dopant having a first conductivity and a channel of the memory cells has a dopant having a second conductivity different from the first conductivity, and a bottom of each of the plurality of trenches includes a dopant of the first conductivity.

3. The EEPROM of claim 2, wherein each of the plurality of transistors includes a source formed in the bottom of the corresponding trench.

4. The EEPROM of claim 3, wherein each of the plurality of transistors includes a drain formed in a region of the source of the corresponding one of the memory cells.

5. The EEPROM of claim 2, wherein the bottom of each trench is coupled to the Vss supply voltage.

6. The EEPROM of claim 1, wherein the EEPROM includes a plurality of word lines each extending along a corresponding row of the memory cells and being operative to select simultaneously each of the memory cells in the corresponding row; and a plurality of control lines each extending between and parallel to a corresponding pair of the word lines, the control lines each being operative to control the conductivity of the transistors connected to the memory cells selected by the pair of word lines adjacent the control line.

7. The EEPROM of claim 6, wherein the source and drain of the memory cells have a dopant having a first conductivity and a channel of the memory cells has a dopant having a second conductivity different from the first conductivity, and a bottom of each of the plurality of trenches includes a dopant of the first conductivity.

8. The EEPROM of claim 7, wherein each of the plurality of transistors includes a source formed in the bottom of the corresponding trench.

9. The EEPROM of claim 8, wherein each of the plurality of transistors includes a drain formed in a region of the source of the corresponding one of the memory cells.

10. The EEPROM of claim 7, wherein the bottom of each trench is coupled to the Vss supply voltage.

* * * * *